US009019752B1

(12) United States Patent
Puckett et al.

(10) Patent No.: US 9,019,752 B1
(45) Date of Patent: Apr. 28, 2015

(54) STATIC RANDOM ACCESS MEMORY (SRAM) GLOBAL BITLINE CIRCUITS FOR REDUCING POWER GLITCHES DURING MEMORY READ ACCESSES, AND RELATED METHODS AND SYSTEMS

(71) Applicant: QUALCOMM Incorporated, San Diego, CA (US)

(72) Inventors: Joshua Lance Puckett, Cary, NC (US); Stephen Edward Liles, Apex, NC (US); Jason Philip Martzloff, Chapel Hill, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/090,288

(22) Filed: Nov. 26, 2013

(51) Int. Cl.
G11C 11/40 (2006.01)
G11C 11/419 (2006.01)
G11C 7/12 (2006.01)

(52) U.S. Cl.
CPC ............... G11C 11/419 (2013.01); G11C 7/12 (2013.01)

(58) Field of Classification Search
CPC .............................. G11C 11/419; G11C 17/12
USPC ............... 365/154, 189.15, 191, 207, 230.03, 365/233.1
See application file for complete search history.

(56) References Cited

U.S. PATENT DOCUMENTS

| 7,423,900 | B2 * | 9/2008 | Tokito ........................... 365/154 |
| 7,668,037 | B2 | 2/2010 | Carpenter et al. |
| 7,679,979 | B1 | 3/2010 | Kim |
| 8,077,533 | B2 | 12/2011 | Hunter et al. |
| 8,325,543 | B2 | 12/2012 | Chan et al. |
| 8,422,313 | B2 | 4/2013 | Buettner et al. |
| 8,587,990 | B2 * | 11/2013 | Chan et al. .................... 365/154 |
| 2011/0317505 | A1 | 12/2011 | Bunce et al. |
| 2011/0320851 | A1 | 12/2011 | Bunce et al. |
| 2013/0094309 | A1 | 4/2013 | Wang |
| 2013/0128680 | A1 | 5/2013 | Holla et al. |

OTHER PUBLICATIONS

International Search Report and Written Opinion for PCT/US2014/067269, mailed Feb. 3, 2015, 13 pages.

* cited by examiner

Primary Examiner — Tan T. Nguyen
(74) Attorney, Agent, or Firm — Withrow & Terranova, PLLC

(57) ABSTRACT

Static random access memory (SRAM) global bitline circuits for reducing glitches during read accesses, and related methods and systems are disclosed. A global bitline scheme in SRAM can reduce output load, reducing power consumption. In certain embodiments, SRAM includes an SRAM array. The SRAM includes a global bitline circuit for each SRAM array column. Each global bitline circuit includes memory access circuit that pre-charges local bitlines corresponding to bitcells in SRAM array. The data read from selected bitcell is read from its local bitline onto aggregated read bitline, an aggregation of local bitlines. The SRAM includes bitline evaluation circuit that sends data from aggregated read bitline onto global bitline. Instead of sending data based on rising transition of clock trigger, data is sent onto the global bitline based on falling transition of clock trigger. A global bitline scheme can be employed that reduces glitches and resulting increases in power consumption.

20 Claims, 7 Drawing Sheets

| OPERATION PERFORMED ON SRAM BITCELL (24) | VALUE STORED IN OUTPUT LATCH (122) FROM PREVIOUS OPERATION | VALUE READ FROM SRAM BITCELL (24) | EFFECT OF GLOBAL BITLINE ENABLE (98) TRIGGERED BY THE FALLING TRANSITION OF SYSTEM CLOCK (46) |
|---|---|---|---|
| Read | 0 | 0 | Reduces or avoids power glitch on global bitline (102), reducing power consumption of circuit |
| Read | 0 | 1 | Prevents an increase in memory read access latency due to the lack of delay cycles added to global bitline enable (98) |
| Read | 1 | 0 | Prevents an increase in memory read access latency due to the lack of delay cycles added to global bitline enable (98) |
| Read | 1 | 1 | Prevents an increase in memory read access latency due to the lack of delay cycles added to global bitline enable (98) |

FIG. 5

STATIC RANDOM ACCESS MEMORY (SRAM) GLOBAL BITLINE CIRCUITS FOR REDUCING POWER GLITCHES DURING MEMORY READ ACCESSES, AND RELATED METHODS AND SYSTEMS

BACKGROUND

I. Field of the Disclosure

The field of the disclosure relates generally to computer memory, and particularly to static random access memory (SRAM) global bitlines for providing memory read access outputs for a memory array.

II. Background

Processor-based computer systems include memory for data storage. Different types of memory exist, each possessing certain unique features. For example, static random access memory (SRAM) is a type of memory that can be employed in processor-based computer systems. SRAM can store data without the need to periodically refresh the memory, unlike dynamic read access memory (DRAM) for example. An SRAM contains a plurality of SRAM bitcells (also referred to as "bitcells") organized in rows and columns in an SRAM data array. For any given row in an SRAM data array, each column of the SRAM data array will contain an SRAM bitcell in which a single data item or bit is stored. Access to a desired SRAM bitcell row is controlled by a corresponding wordline for read and write operations. To read data from an SRAM bitcell, a wordline is asserted to select a desired row of SRAM bitcells corresponding to a memory address of a memory access request. For a read operation (also referred to as a "memory read access"), data read from the selected SRAM bitcell is placed on a local bitline to be provided to an SRAM data output. For a write operation, data to be written to the SRAM bitcell is placed on the local bitline for the SRAM bitcell. Complementary local bitlines may also be employed to improve noise margins in the SRAM bitcell. Further, an SRAM data array may have multiple data sub-arrays or banks that each contain their own access circuitry and dedicated local wordlines and bitlines allowing for accesses in multiple data sub-arrays at the same time.

An SRAM may also employ the use of global bitlines in addition to local bitlines corresponding to particular bitcells. Global bitlines can be employed to aggregate the local bitlines of the SRAM bitcells for each column of an SRAM data array so as to output data corresponding to only one bitcell in each column of the SRAM data array at a time. This aggregation is possible because the wordline can only select one row of an SRAM data array for each read operation. Thus, only the bitcell of each column that corresponds to the row selected by the wordline will have its data read onto its local bitline for a given read operation. No data values are lost due to aggregation since only the local bitlines corresponding to the selected row, and reflected on the global bitlines, possess data read from a bitcell. This aggregation provides a smaller load on the SRAM data output as compared to a load created when providing the local bitlines for every bitcell to the SRAM data output. This smaller load allows the SRAM data output to consist of transistors that require lower drive current, thus reducing power consumption within the SRAM.

While employing a global bitline scheme in an SRAM may provide a smaller output load on SRAM data outputs, employing global bitlines in an SRAM can have certain disadvantages. For example, employing a global bitline scheme in an SRAM may result in unintended power glitches during SRAM read operations. A power glitch can occur when the global bitline is incorrectly set to a logical '1' value (e.g., voltage of a voltage supply rail) for a certain length of time when the output should equal a logical '0' value (e.g., voltage of ground). Such a power glitch can be the result of certain circuit timing characteristics. Moreover, the errant logical '1' value on the global bitline, caused by a power glitch, increases the power consumption of the SRAM.

One solution to prevent power glitches in an SRAM due to such circuit timing characteristics involves delaying the transfer of data read from the local bitlines so that such data is not prematurely placed onto a global bitline. However, delaying the transfer of data in this way can cause the global bitline to receive the data later in time, thus increasing the latency of a memory read operation. This increased latency incurred for SRAM read operations may not be desirable or may cause the SRAM to be outside desired memory access time specifications. Thus, it would be advantageous to employ global bitlines in an SRAM to reduce the load on the SRAM data output while reducing or avoiding power glitches arising during SRAM read operations without increasing the latency of such operations.

SUMMARY OF THE DISCLOSURE

Embodiments disclosed in the detailed description include static random access memory (SRAM) global bitline circuits for reducing power glitches during memory read accesses, and related methods and systems. Employing a global bitline scheme in an SRAM can reduce the load placed on the SRAM data output, thus reducing power consumption. In embodiments disclosed herein, an SRAM is provided that includes an SRAM data array. The SRAM includes a memory access circuit for each column of the SRAM data array configured to pre-charge local bitlines corresponding to a plurality of SRAM bitcells (also referred to as "bitcells") in a column of the SRAM data array. The data to be read from a selected SRAM bitcell is read from its local bitline onto an aggregated read bitline that is comprised of an aggregation of the local bitlines from the SRAM bitcells for the corresponding column of the SRAM data array. The SRAM also includes an SRAM global bitline circuit for each column of the SRAM data array. Each SRAM global bitline circuit includes a bitline evaluation circuit configured to send the data from the aggregated read bitline for the selected SRAM bitcell onto a global bitline coupled to an SRAM data output.

Instead of triggering the sending of the data from the aggregated read bitline onto the global bitline based on a rising transition of a system clock, the sending of the data onto the global bitline is triggered based on a falling transition of the system clock. In this manner, a global bitline scheme can be employed in an SRAM that reduces or avoids power glitches so as to reduce or avoid increases in power consumption as a result. If the global bitline scheme were triggered to send the data from the aggregated read bitline onto the global bitline based on a rising transition of the system clock, the sending of the data may need to be delayed in order to avoid or reduce power glitches, but at the expense of increasing memory read access latency.

Thus, in embodiments disclosed herein, a global bitline enable generation circuit is provided in SRAM global bitline circuits of the SRAM. The global bitline enable generation circuit is configured to trigger the sending of the data from the aggregated read bitline to the global bitline based on a falling transition of the system clock. The global bitline enable generation circuit is configured to generate a global bitline enable in response to detection of a falling transition of the system clock. A bitline evaluation circuit can also be provided in each SRAM global bitline circuit that is configured to receive the global bitline enable and transfer the data from the aggregated read bitline to the global bitline coupled to the SRAM data output.

In this regard, in one embodiment, an SRAM global bitline circuit for a plurality of SRAM bitcells is provided. The SRAM global bitline circuit comprises a global bitline enable generation circuit configured to generate a global bitline enable in response to a falling transition of a system clock. The SRAM global bitline circuit also comprises a bitline evaluation circuit coupled to an aggregated read bitline configured to receive data stored in a selected SRAM bitcell among a plurality of SRAM bitcells of an SRAM data array. The bitline evaluation circuit is configured to receive the data from the selected SRAM bitcell on the aggregated read bitline and generate a global bitline provided as an SRAM data for the SRAM data array containing the data in response to the global bitline enable. In this manner, a global bitline scheme can be employed in an SRAM that reduces or avoids power glitches so as to reduce or avoid increases in power consumption as a result. If the global bitline scheme were triggered to send the data from the aggregated read bitline onto the global bitline based on a rising transition of the system clock, the sending of the data may need to be delayed in order to avoid or reduce power glitches, but at the expense of increasing memory read access latency.

In another embodiment, an SRAM global bitline circuit for a plurality of SRAM bitcells is provided. The SRAM global bitline circuit is comprised of a means for generating a global bitline enable in response to a falling transition of a system clock. The SRAM global bitline circuit also comprises a means for receiving data read from a selected SRAM bitcell on an aggregated read bitline configured to receive the data stored in the selected SRAM bitcell of an SRAM data array. The SRAM global bitline circuit also comprises means for generating a global bitline in response to the global bitline enable, in which the global bitline is provided as an SRAM data.

In another embodiment, a method of generating an SRAM global bitline is provided. The method comprises generating a global bitline enable in response to a falling transition of a system clock. The method also comprises receiving data from a selected SRAM bitcell among a plurality of SRAM bitcells on an aggregated read bitline, wherein the data stored in the selected SRAM bitcell of an SRAM data array is placed onto the aggregated read bitline. The method also comprises generating a global bitline provided as an SRAM data output for the SRAM data array containing the data in response to the global bitline enable.

In another embodiment, an SRAM is provided. The SRAM comprises an SRAM data array comprised of a plurality of columns. The SRAM also comprises a plurality of memory access circuits, in which each memory access circuit is operatively associated with a column. Each memory access circuit is configured to pre-charge a plurality of read bitlines of a plurality of SRAM bitcells in response to a pre-charge. Each memory access circuit is further configured to read data stored in a selected SRAM bitcell among the plurality of SRAM bitcells onto a corresponding local bitline among the plurality of pre-charged read bitlines. The memory access circuit is further configured to aggregate the plurality of pre-charged read bitlines into an aggregated read bitline to place data from the selected SRAM bitcell onto the aggregated read bitline. The SRAM also comprises a plurality of SRAM global bitline circuits, wherein each SRAM global bitline circuit is operatively associated with a memory access circuit. Each SRAM global bitline circuit comprises a global bitline enable generation circuit that is configured to generate a global bitline enable in response to a falling transition of a system clock. Each SRAM global bitline circuit also comprises a bitline evaluation circuit that is configured to receive data from the selected SRAM bitcell on the aggregated read bitline and generate a global bitline as an SRAM data in response to the global bitline enable. The SRAM also comprises a row data output comprised of the plurality of SRAM data outputs of the plurality of SRAM global bitline circuits.

BRIEF DESCRIPTION OF THE FIGURES

FIG. 5 is a table diagram illustrating an exemplary effect of memory read accesses of certain values performed by the SRAM of FIG. 3 when certain previous values are stored in an output latch;

DETAILED DESCRIPTION

Figure 1:
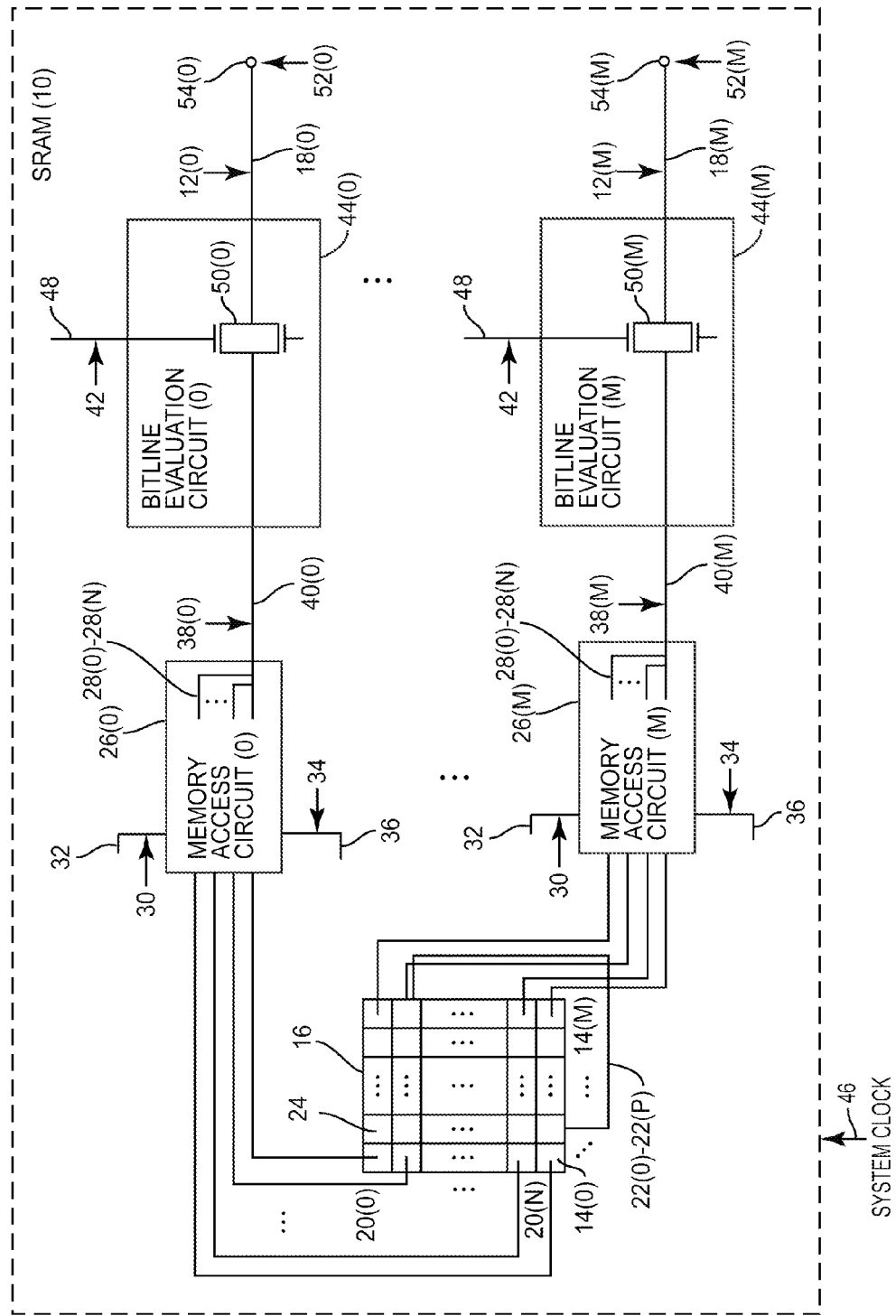
FIG. 1 is a diagram of an exemplary static random access memory (SRAM) employing global bitlines for aggregating local bitlines of each column and outputting data from a single SRAM bitcell for each column of an SRAM data array.

With reference now to the drawing figures, several exemplary embodiments of the present disclosure are described. The word "exemplary" is used herein to mean "serving as an example, instance, or illustration." Any embodiment described herein as "exemplary" is not necessarily to be construed as preferred or advantageous over other embodiments.

Embodiments disclosed in the detailed description include static random access memory (SRAM) global bitline circuits for reducing power glitches during memory read accesses, and related methods and systems. Employing a global bitline scheme in an SRAM can reduce the load placed on the SRAM data output, thus reducing power consumption. In embodiments disclosed herein, an SRAM is provided that includes an SRAM data array. The SRAM includes a memory access circuit for each column of the SRAM data array configured to pre-charge local bitlines corresponding to a plurality of SRAM bitcells (also referred to as "bitcells") in a column of the SRAM data array. The data to be read from a selected SRAM bitcell is read from its local bitline onto an aggregated read bitline that is comprised of an aggregation of the local bitlines from the SRAM bitcells for the corresponding column of the SRAM data array. The SRAM also includes an SRAM global bitline circuit for each column of the SRAM data array. Each SRAM global bitline circuit includes a bitline evaluation circuit configured to send the data from the aggregated read bitline for the selected SRAM bitcell onto a global bitline coupled to an SRAM data output.

Instead of triggering the sending of the data from the aggregated read bitline onto the global bitline based on a rising transition of a system clock, the sending of the data onto the global bitline is triggered based on a falling transition of the system clock. In this manner, a global bitline scheme can be employed in an SRAM that reduces or avoids power glitches so as to reduce or avoid increases in power consumption as a result. If the global bitline scheme were triggered to send the data from the aggregated read bitline onto the global bitline based on a rising transition of the system clock, the sending of the data may need to be delayed in order to avoid or reduce power glitches, but at the expense of increasing memory read access latency.

Thus, in embodiments disclosed herein, a global bitline enable generation circuit is provided in SRAM global bitline circuits of the SRAM. The global bitline enable generation circuit is configured to trigger the sending of the data from the aggregated read bitline to the global bitline based on a falling transition of the system clock. The global bitline enable generation circuit is configured to generate a global bitline enable in response to detection of a falling transition of the system clock. A bitline evaluation circuit can also be provided in each SRAM global bitline circuit that is configured to receive the global bitline enable and transfer the data from the aggregated read bitline to the global bitline coupled to the SRAM data output.

Figure 3:
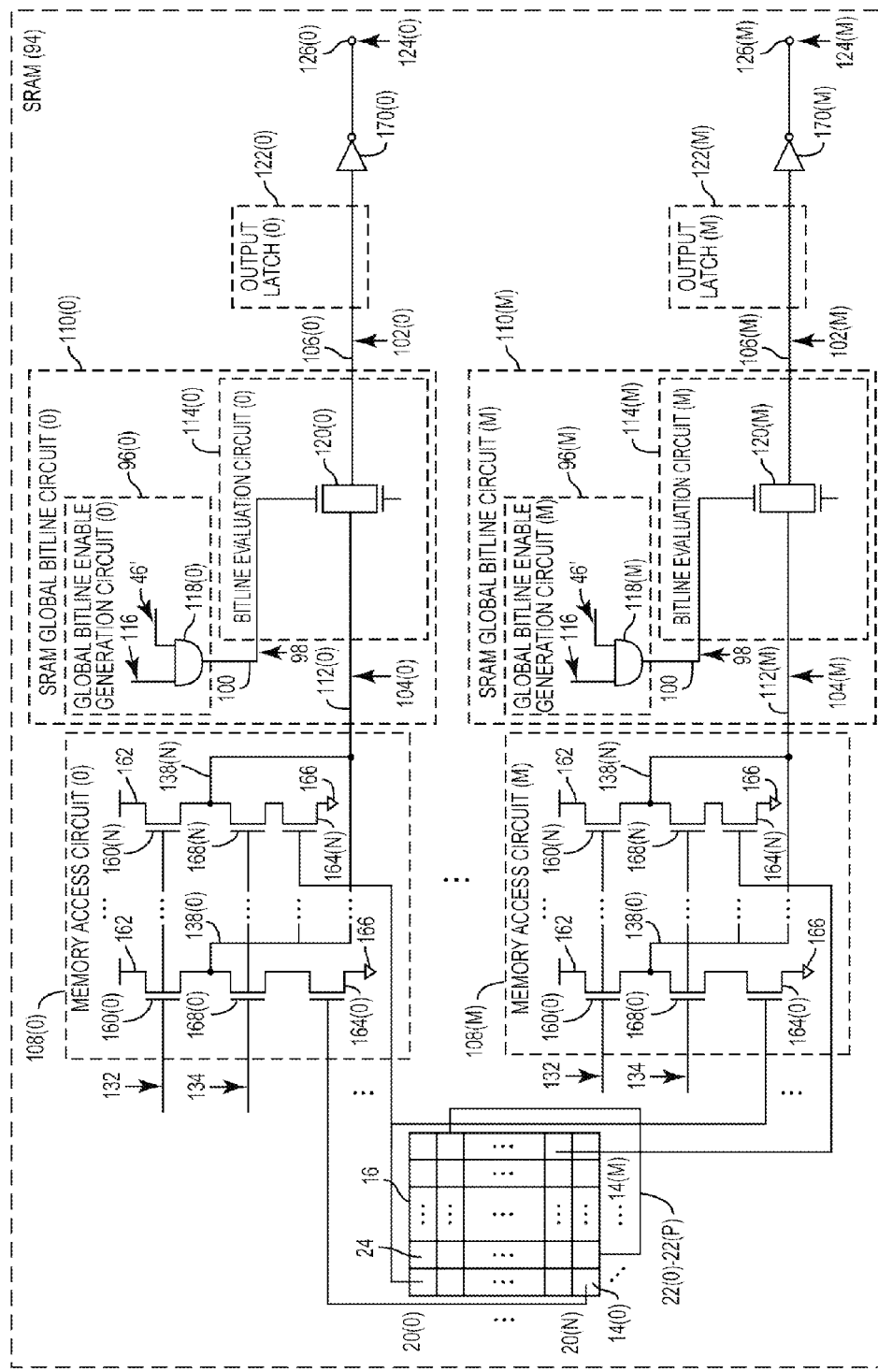
FIG. 3 is an exemplary SRAM that includes an exemplary SRAM circuit employing bitline evaluation circuitry for generating global bitlines with a global bitline enable triggered by a falling transition of a system clock, so as to reduce power glitches during memory read accesses without increased latency.

In this regard, before discussing examples of SRAM global bitline circuits having a global bitline enable generation circuit configured to generate a global bitline enable based on a falling transition of a system clock starting at FIG. 3, an example of an SRAM global bitline circuit that generates a global bitline enable based on a rising transition of a system clock is first described with regard to FIG. 1.

FIG. 1 illustrates an exemplary SRAM 10 that employs global bitlines 12(0)-12(M) for each corresponding column 14(0)-14(M) of an SRAM data array 16. Each global bitline 12(0)-12(M) is generated on a global bitline output 18(0)-18(M). The SRAM data array 16 employs a plurality of global bitlines 12(0)-12(M), where 'M+1' is the number of columns 14(0)-14(M), and 'N+1' is the number of rows 20(0)-20(N) in the SRAM data array 16. For clarity, components relating only to column 14(0) of the SRAM data array 16 will be discussed in this example. However, this example is equally applicable to the other columns 14(1)-14(M) of the SRAM data array 16. This example is also equally applicable when the SRAM data array 16 is divided into SRAM data sub-arrays 22(0)-22(P).

As illustrated in FIG. 1, data from each SRAM bitcell 24 of column 14(0) is input into a memory access circuit 26(0). The memory access circuit 26(0) pre-charges each local bitline 28(0)-28(N) to a logical '1' value in response to a pre-charge 30 upon initiation of a read operation. The pre-charge 30 is generated on a pre-charge input 32. Shortly after such pre-charging, a wordline 34 selects which row 20(0)-20(N) has its SRAM bitcell 24 data read onto its local bitline 28. The wordline 34 is generated on a wordline input 36. The local bitlines 28(0)-28(N) are aggregated to form an aggregated read bitline 38(0). The aggregated read bitline 38(0) is generated on an aggregated read bitline output 40(0). The value of the aggregated read bitline 38(0) equals the data stored in the SRAM bitcell 24 corresponding to the row 20(0)-20(N) selected by the wordline 34. The aggregated read bitline 38(0) and a global bitline enable 42 are input into a bitline evaluation circuit 44(0) based on a rising transition of a system clock 46. The global bitline enable 42 is generated on a global bitline enable output 48. The global bitline enable 42 triggers a latch 50(0) within the bitline evaluation circuit 44(0), allowing the global bitline 12(0) to assume the value of the aggregated read bitline 38(0). The global bitline 12(0) is output onto SRAM data 52(0). The SRAM data 52(0) is generated on an SRAM data output 54(0). As illustrated in FIG. 1, the global bitline 12 is employed for each column 14(0)-14(M) of the SRAM data array 16, allowing the global bitlines 12(0)-12(M) to output one full row 20 of the SRAM data array 16 at one time.

As previously described above, the global bitline 12(0) in the SRAM 10 of FIG. 1 reduces power consumption by placing a smaller load onto the SRAM data 52(0) as compared to a circuit that outputs each local bitline 28(0)-28(N). This is because the global bitline 12(0) outputs data from a single SRAM bitcell 24 rather than data for each SRAM bitcell 24 within the column 14(0). Despite such power savings, as discussed below, the timing characteristics of the global bitline scheme employed in the bitline evaluation circuit 44(0) in the SRAM 10 in FIG. 1 can result in power glitches on the global bitline 12(0), thereby increasing the power consumption of the SRAM 10.

Figure 2A:
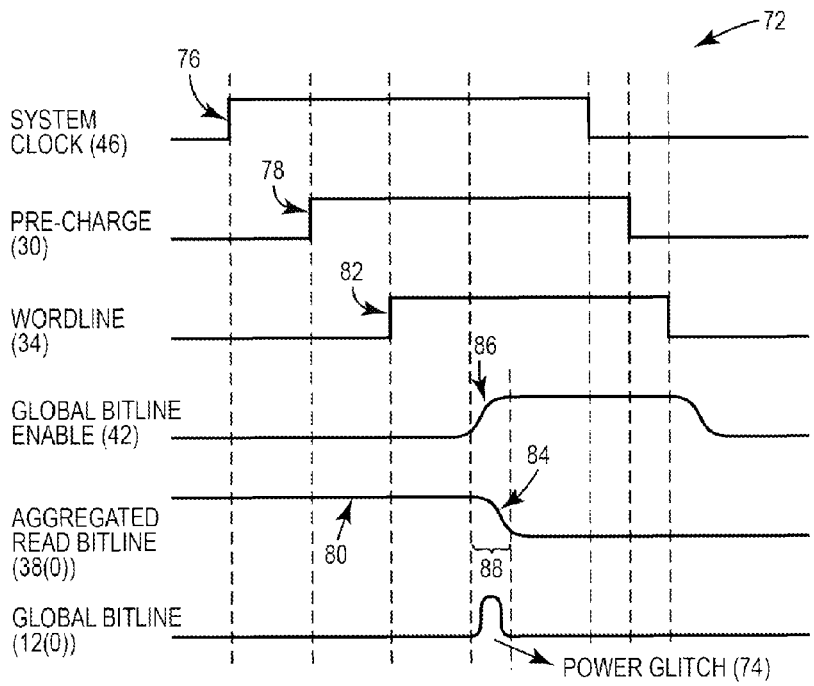
FIG. 2A is an exemplary timing diagram that illustrates the exemplary timing of signals within the SRAM of FIG. 1 generated when performing a memory read access without additional delay imposed on a global bitline enable.

In this regard, FIG. 2A illustrates the exemplary timing of signals 72 within the SRAM 10 of FIG. 1 when performing a memory read access that results in a power glitch 74 on the global bitline 12(0). As shown and discussed below, the global bitline enable 42 is triggered by a rising transition of the system clock 46. As illustrated in FIG. 2A, during a memory read access in the SRAM 10, following the rising transition 76 of the system clock 46, the pre-charge 30, the wordline 34, and the global bitline enable 42 transition high. The pre-charge 30 transitions at transition 78 to a logical '1' value, which causes the local bitlines 28(0)-28(N) to be pre-charged to a logical '1' value. Pre-charging the local bitlines 28(0)-28(N) causes the memory access circuit 26(0) of the SRAM 10 to assert a logical '1' value at transition 80 on the aggregated read bitline 38(0). Assertion of the wordline 34 by the SRAM 10, shown as 82 in FIG. 2A, causes the SRAM bitcell 24 on the selected row 20 within the column 14(0) of the SRAM data array 16 in FIG. 1 to be read onto its corresponding local bitline 28. The local bitlines 28(0)-28(N) are aggregated by the memory access circuit 26(0) of the SRAM 10, placing the value, shown as 84 in FIG. 2A, of the read SRAM bitcell 24 onto the aggregated read bitline 38(0). Control circuitry asserts the global bitline enable 42, shown as 86 in FIG. 2A, enabling the bitline evaluation circuit 44(0) to transfer data from the aggregated read bitline 38(0) onto the global bitline 12(0). However, in the scenario that the data on the global bitline 12(0) from a previous memory read access is a logical '0' and a subsequent memory read access causes the memory access circuit 26(0) to place a logical '0' value onto the aggregated read bitline 38(0), the timing characteristics of the SRAM 10 may cause a power glitch 74 on the global bitline 12(0), as illustrated in FIG. 2A. This power glitch 74 is due to the global bitline enable 42 being asserted prematurely by the control circuitry before the logical '0' value, shown as 88 in FIG. 2A, of the selected SRAM bitcell 24 is transferred to the memory access circuit 26(0) onto the aggregated read bitline 38(0). More specifically, the timing of the global bitline enable 42 allows the bitline evaluation circuit 44(0) to incorrectly transfer the pre-charged logical '1' value of the aggregated read bitline 38(0) onto the global bitline 12(0) before the aggregated read bitline 38(0) properly assumes the correct logical '0' value of the local bitline 28. As a result, an errant positive voltage may be placed onto the global bitline 12(0), thereby increasing power consumption in the SRAM 10.

Figure 2B:
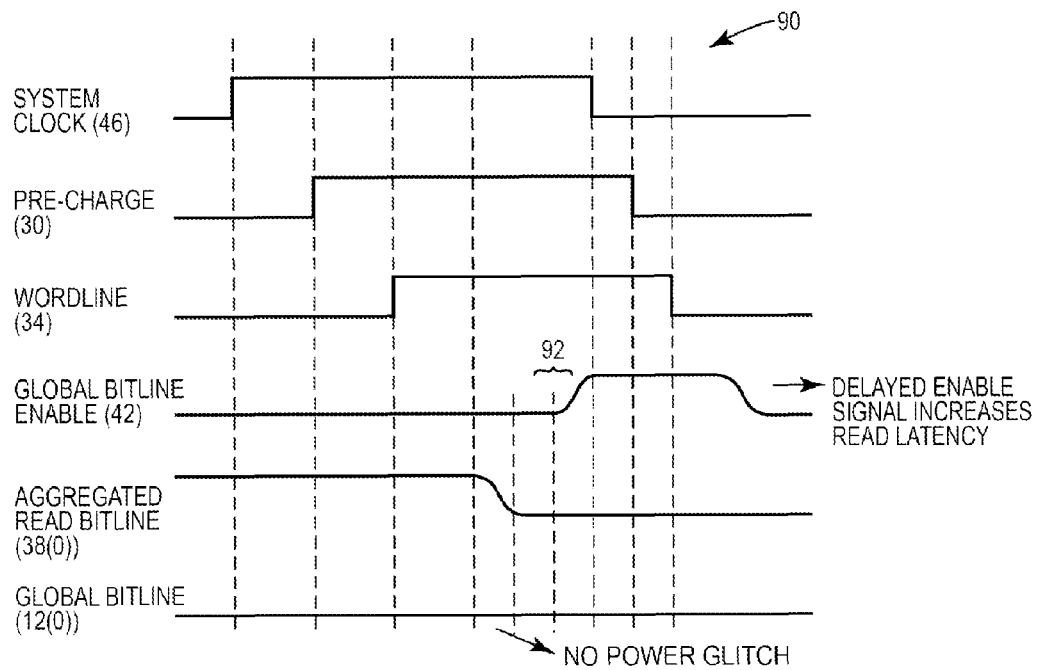
FIG. 2B is an exemplary timing diagram that illustrates the exemplary timing of signals within the SRAM of FIG. 1 generated when performing a memory read access in the SRAM with additional delay imposed on a global bitline enable.

As illustrated in the exemplary timing of signals 90 in FIG. 2B, such power glitches may be avoided or reduced in this embodiment by control circuitry delaying the rise of the global bitline enable 42. However, with continuing reference to FIG. 2B, delaying the global bitline enable 42 in order to avoid a power glitch also delays the bitline evaluation circuit 44(0) from transferring the data from the aggregated read bitline 38(0) onto the global bitline 12(0). Such a delay, shown as 92 in FIG. 2B, requires additional time to complete a memory read access, thus increasing the read latency of the SRAM 10. Thus, it would be advantageous to employ global bitlines in an SRAM while reducing or avoiding power glitches arising during memory read accesses without increasing the latency of such operations.

In this regard, FIG. 3 illustrates another exemplary SRAM 94. The SRAM 94 includes certain common components and circuits with the SRAM 10 in FIG. 1, which are shown with common element numbers between FIGS. 1 and 3. However, unlike the SRAM 10 in FIG. 1, the SRAM 94 in FIG. 3 employs a global bitline scheme that uses global bitline enable generation circuits 96(0)-96(M) configured to generate a global bitline enable 98 on a global bitline enable input 100 based on a falling transition of the system clock 46. This is opposed to the control circuit in the SRAM 10 in FIG. 1, which generates the global bitline enable 42 based on the rising transition 76 of the system clock 46, as illustrated in FIG. 2A. In this manner, power glitches on a global bitline 102(0) in the SRAM 94 in FIG. 3 caused by the global bitline 102(0) prematurely assuming the value of an aggregated read bitline 104(0) in response to the global bitline enable 98 rising too early may be reduced or avoided without adding a delay to the global bitline enable 98. As a result of reducing or avoiding such power glitches in this fashion, associated increases in power consumption may be reduced or avoided without increasing memory read access latency.

In this regard, with continuing reference to FIG. 3, similar to the SRAM 10 in FIG. 1, the SRAM 94 in FIG. 3 employs a global bitline 102(0)-102(M) for each column 14(0)-14(M) of an SRAM data array 16. The global bitlines 102(0)-102(M) are generated on a global bitline output 106(0)-106(M). The SRAM 94 of FIG. 3 also employs memory access circuits 108(0)-108(M) that provide each aggregated read bitline 104(0)-104(M) to a corresponding SRAM global bitline circuit 110(0)-110(M). Each aggregated read bitline 104(0)-104(M) is generated on an aggregated read bitline output 112(0)-112(M). Similar to FIG. 1 described above, for clarity, components relating only to column 14(0) of the SRAM data array 16 and global bitline 102(0) will be discussed in this example. However, this example is equally applicable to the other columns 14(1)-14(M) of the SRAM data array 16 and other global bitlines 102(1)-102(M), as well as to other columns 14 in other SRAM data sub-arrays 22 within the SRAM 94.

With continuing reference to FIG. 3, the global bitline enable generation circuit 96(0) and a bitline evaluation circuit 114(0) are both included in the SRAM global bitline circuit 110(0). The global bitline enable generation circuit 96(0) receives an active high global bitline enable 116 and an inverted system clock 46', and provides the global bitline enable 98 based on the falling transition of the system clock 46. In this embodiment, the global bitline enable 98 is generated by an AND-based gate 118(0) (e.g., a NAND gate) that receives the active high global bitline enable 116 and the inverted system clock 46'. The global bitline enable 98 triggers a latch 120(0) within the bitline evaluation circuit 114(0), allowing the global bitline 102(0) to assume the value of the aggregated read bitline 104(0). An output latch 122(0) may be situated on the global bitline output 106(0) to latch the read value, and the global bitline 102(0) is coupled to SRAM data 124(0). Each SRAM data 124(0)-124(M) is generated on an SRAM data output 126(0)-126(M). In this manner, triggering the global bitline enable 98 with the falling transition of the system clock 46 may reduce or avoid power glitches on the global bitline 102(0). Specifically, depending on the frequency of the system clock 46, triggering the global bitline enable 98 in this manner may prevent the bitline evaluation circuit 114(0) from prematurely placing the value of the aggregated read bitline 104(0) onto the global bitline 102(0).

Figure 4A:
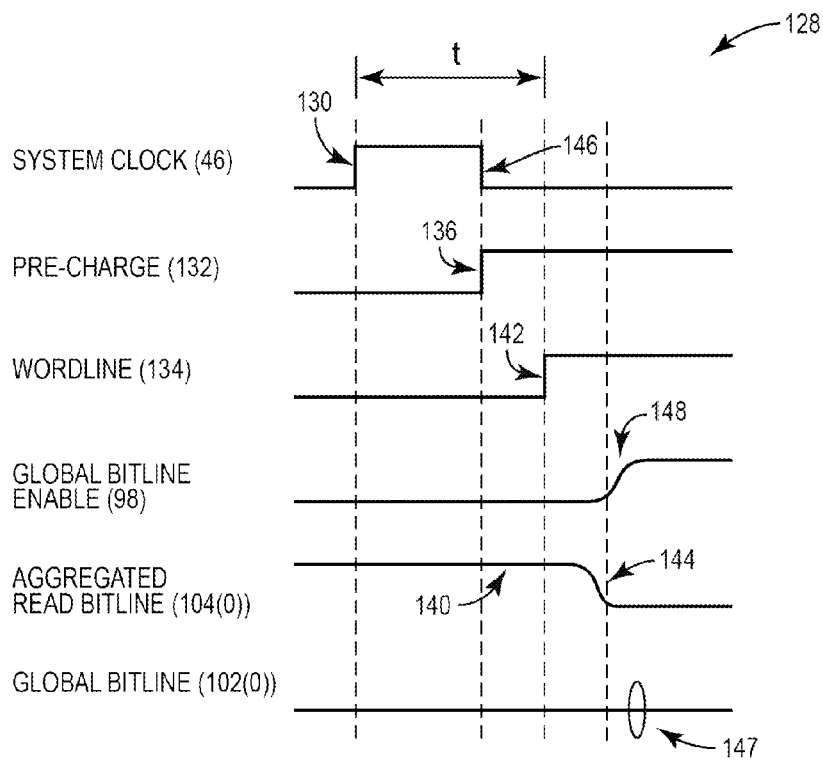
FIG. 4A is an exemplary timing diagram that illustrates the exemplary timing of signals within the SRAM circuit of FIG. 3 generated when performing a memory read access while operating at a high clock frequency.

In this regard, FIG. 4A illustrates the exemplary timing of signals 128 within the SRAM 94 of FIG. 3 generated when performing a memory read access while operating at a first frequency. As discussed below in further detail, the first frequency of FIG. 4A is a higher frequency than a second frequency illustrated in FIG. 4B. As illustrated in FIG. 4A, during a memory read access in the SRAM 94, following a rising transition 130 of the system clock 46, a pre-charge 132 and a wordline 134 transition high. A logical '1' value on the pre-charge 132 at transition 136 causes local bitlines 138(0)-138(N) of the memory access circuit 108(0) to be pre-charged, which in turn places a logical '1' value at time 140 onto the aggregated read bitline 104(0). Further, assertion of the wordline 134, shown as 142 in FIG. 4A, causes the memory access circuit 108(0) to read the SRAM bitcell 24 on the selected row 20 within the column 14(0) onto its corresponding local bitline 138. The local bitlines 138(0)-138(N) are aggregated, and the memory access circuit 108(0) places the value, shown as 144 in FIG. 4A, of the read SRAM bitcell 24 onto the aggregated read bitline 104(0). The global bitline enable 98 is generated by the global bitline enable generation circuit 96(0), which is triggered by the falling transition of the system clock 46, shown as 146 in FIG. 4A, and allows the bitline evaluation circuit 114(0) to place the aggregated read bitline 104(0) value onto the global bitline 102(0) at time 147. As illustrated in FIG. 4A as 148, the global bitline enable 98 is asserted following the aggregated read bitline 104(0) assuming a logical '0' value. In the scenario in which the previous value of the global bitline 102(0) and the value read onto the aggregated read bitline 104(0) by the memory access circuit 108(0) are both a logical '0' value, a power glitch may be avoided on the global bitline 102(0). This is because the global bitline enable 98 does not allow the bitline evaluation circuit 114(0) to transfer the aggregated read bitline 104(0) to the global bitline 102(0) prior to transitioning from the pre-charge logical '1' value to the read logical '0' value. However, based on the timing characteristics within the SRAM 94 of FIG. 3, a power glitch may still occur when operating at the first frequency illustrated in FIG. 4A. In certain instances, the negative impact of such power glitches is acceptable in light of the increased performance achieved as a result of operating at a frequency as high as the first frequency. In contrast, when operating at a frequency lower than the first frequency, for example, during a lower power mode, power glitches and resulting increases in power consumption are not off-set by gains in performance, and are thus undesirable.

Figure 4B:
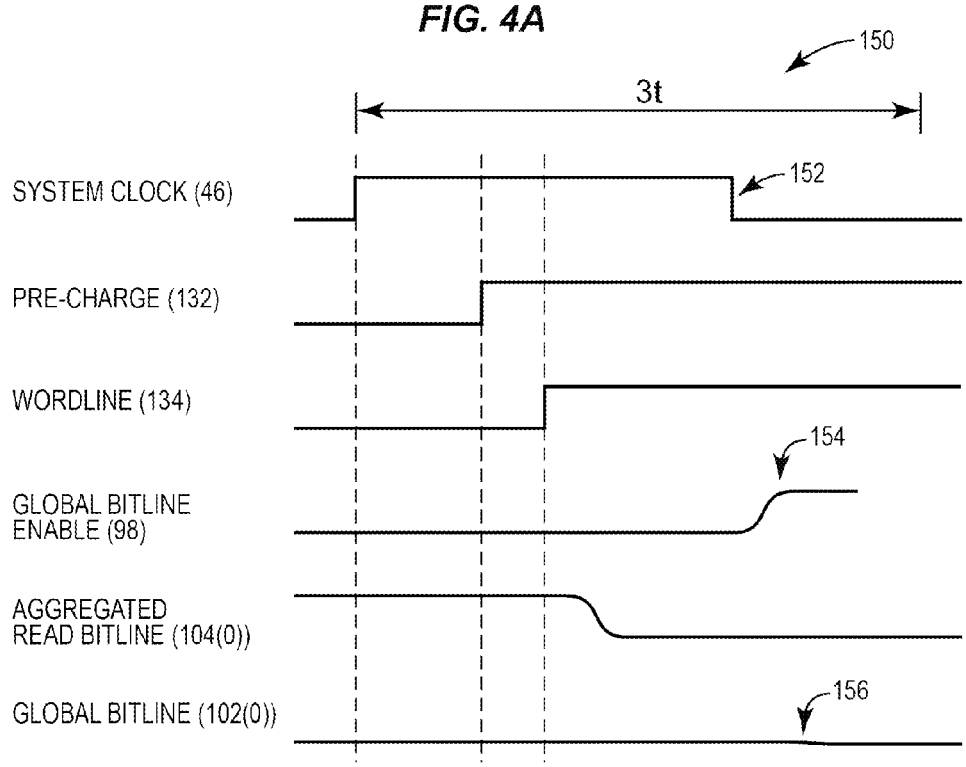
FIG. 4B is an exemplary timing diagram that illustrates the exemplary timing of signals within the SRAM circuit of FIG. 3 generated when performing a memory read access while operating at a clock frequency lower than the clock frequency represented in FIG. 4A.

In this regard, FIG. 4B illustrates the exemplary timing of signals 150 within the SRAM 94 of FIG. 3 generated when performing a memory read access while operating at the second frequency, which is a lower frequency than the first frequency of FIG. 4A. The signals illustrated in FIG. 4B share similar properties to those in FIG. 4A, with the exception of the system clock 46. While the system clock 46 operates with a period 't' in FIG. 4A, the system clock 46 in FIG. 4B operates with a longer period '3t,' resulting in the second frequency being lower than the first frequency of FIG. 4A. As a result of the lower second frequency, a falling transition 152 of the system clock 46 occurs later in time as compared to that of the higher first frequency of FIG. 4A. Thus, the global bitline enable 98, which is generated by the global bitline enable generation circuit 96(0) in response to the falling transition 152 of the system clock 46, also asserts later in time as compared to the same signal in FIG. 4A. However, as a result, the global bitline enable generation circuit 96(0) will not assert the global bitline enable 98 until a later time, shown as 154 in FIG. 4B, which is after the logical '0' value is placed onto the aggregated read bitline 104(0) by the memory access circuit 108(0). Moreover, although the global bitline enable 98 asserts later in time than if it were triggered by a rising transition of the system clock 46, the memory read access latency is not increased because the value is placed onto the global bitline 102(0) by the bitline evaluation circuit 114(0), shown as 156 in FIG. 4B, prior to the start of the next system clock 46 cycle. As a result, a power glitch on the global bitline 102(0) is avoided without including a delay on the global bitline enable 98 when the SRAM 94 operates at the lower second frequency. Thus, when operating at the second frequency, triggering the global bitline enable 98 with the falling transition of the system clock 46 reduces or avoids power glitches in certain situations so as to reduce or avoid increases in power consumption, without increasing the latency of a memory read access.

In this regard, FIG. 5 is a table diagram 158 illustrating the exemplary effect of memory read accesses of certain values performed by the SRAM 94 of FIG. 3 when certain previous values are stored in the output latch 122(0). As illustrated in FIG. 5, if the value stored in the output latch 122(0) from a previous operation is a logical '0,' and a subsequent memory read access results in a logical '0' value being placed onto the global bitline 102(0) (also referred to as a "stored 0/read 0" scenario), a power glitch is avoided, thus reducing power consumption without increasing the memory read access latency. However, if the value stored in the output latch 122(0) from a previous operation is a logical '0,' and a subsequent memory read access results in a logical '1' being placed onto the global bitline 102(0), a power glitch is not avoided. This is because a logical '1' is placed onto the global bitline 102(0), and it remains a logical '1' value until a memory read access replaces it with a logical '0' value. Although there is no power glitch to avoid in this situation, triggering the global bitline enable 98 with the falling transition of the system clock 46 still provides the benefit of reducing or avoiding power glitches in the "stored 0/read 0" scenario while avoiding an increase in the memory read access latency due to delaying the global bitline enable 98. The same result occurs for any memory read access taking place when the output latch 122(0) has a logical '1' stored from a previous operation. This is because the global bitline 102(0) value will remain a logical '1' if a logical '1' is placed onto the global bitline 102(0), or will transition from a logical '1' to a logical '0' value. Thus, neither scenario will cause the global bitline 102(0) to transition temporarily to an errant logical '1' value. Although no power glitches are caused or avoided in these scenarios, the SRAM 94 of FIG. 3 still reduces or avoids power glitches in the "stored 0/read 0" scenario while avoiding an increase in the memory read access latency.

With continuing reference to FIG. 3, the memory access circuit 108(0) is now described to provide further detail. In this embodiment, the memory access circuit 108(0) includes logic corresponding to each SRAM bitcell 24 within the column 14(0) of the SRAM data array 16. Pre-charge transistors 160(0)-160(N) are included for each corresponding SRAM bitcell 24 within the column 14(0). The pre-charge transistor 160(0) is coupled to a power supply 162 and the local bitline 138(0), and receives the pre-charge 132. The pre-charge 132 activates the pre-charge transistor 160(0) at the initiation of a memory read access, thereby placing a logical '1' value onto the local bitlines 138(0)-138(N). Each SRAM bitcell 24 within the column 14(0) is provided to a corresponding active high data transistor 164(0)-164(N), which is coupled to a corresponding ground source 166 and wordline transistor 168(0)-168(N). If the SRAM bitcell 24 data equals a logical '0' value, the data transistor 164(0) remains open and no data is transferred into the memory access circuit 108(0). If the SRAM bitcell 24 data equals a logical '1' value, the data transistor 164(0) is activated, and a logical '0' value (e.g., a ground voltage) is transferred to the wordline transistor 168(0). The wordline transistor 168(0) is coupled to the data transistor 164(0) and the local bitline 138(0), and receives the wordline 134 to indicate whether a particular row 20 is selected for the memory read access.

Upon activation of the wordline transistor 168(0), if a value is provided by the data transistor 164(0), the value is provided to the local bitline 138(0). Thus, if the SRAM bitcell 24 activates the data transistor 164(0) with a logical '1' value, and the wordline 134 activates the wordline transistor 168(0), the local bitline 138(0) receives the logical '0' value. However, if either the data transistor 164(0) or the wordline transistor 168(0) is not activated, the local bitline 138(0) remains at the pre-charged logical '1' value. Each local bitline 138(0)-138(N) is aggregated into the aggregated read bitline 104(0), which is provided to the SRAM global bitline circuit 110(0) by the memory access circuit 108(0). When aggregating the local bitlines 138(0)-138(N), if any local bitline 138 receives a logical '0' value, that value is transferred onto the aggregated read bitline 104(0). Otherwise, the aggregated read bitline 104(0) will receive the pre-charged logical '1' value of the local bitlines 138(0)-138(N). Because the data transistors 164(0)-164(N) are active high in this embodiment, an inverter 170(0) is included between the global bitline output 106(0) and the SRAM data output 126(0) so that the value read from a SRAM bitcell 24 is properly represented on the SRAM data 124(0). In another embodiment, the inverter 170(0) may be removed if active low data transistors are used instead of the active high data transistors 164(0)-164(N). In either embodiment of the memory access circuit 108(0) described above, triggering the global bitline enable 98 with the falling transition of the system clock 46 may reduce or avoid power glitches on the global bitline 102(0).

Figure 6:
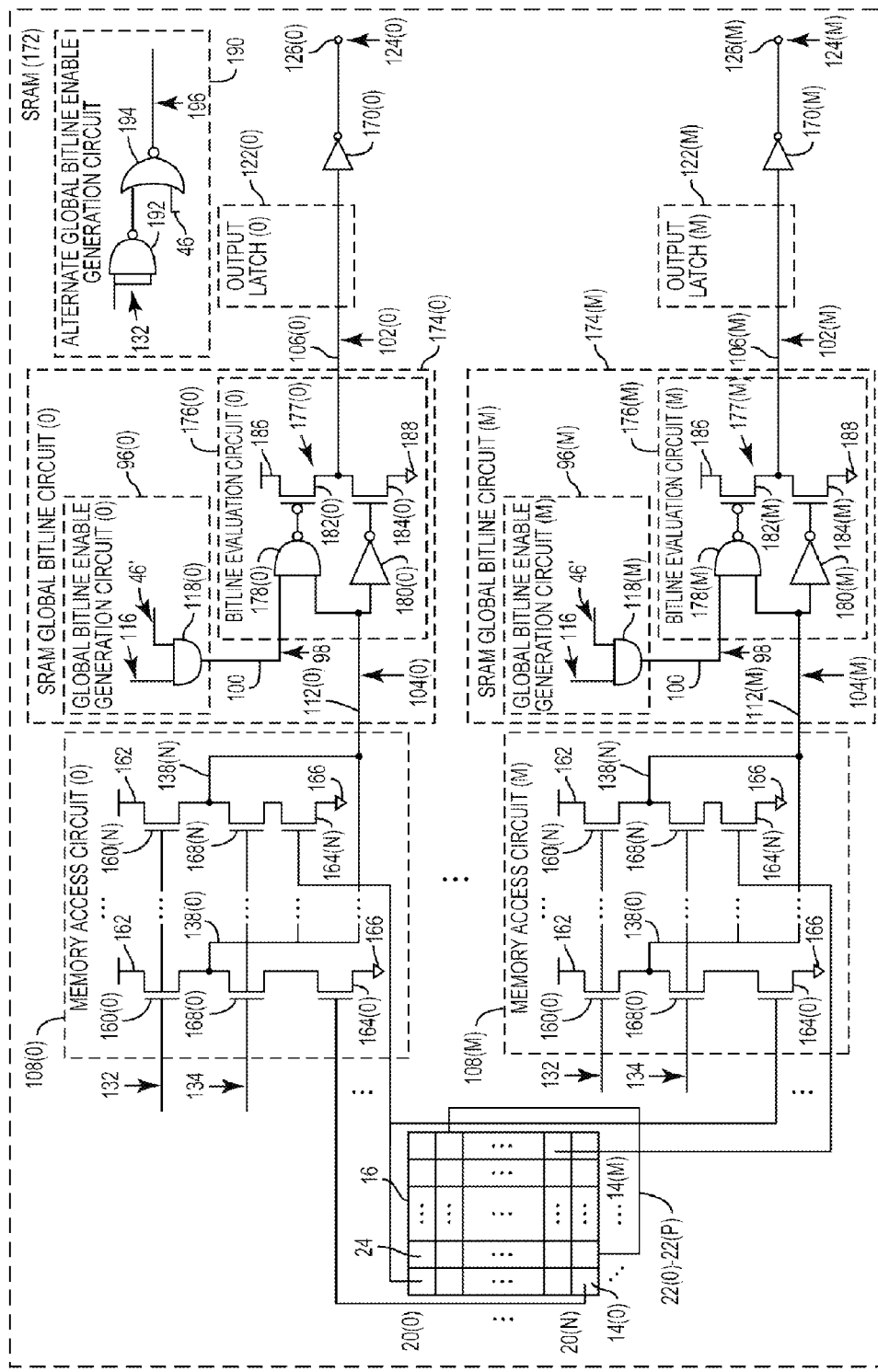
FIG. 6 is another exemplary SRAM that includes an SRAM circuit employing alternative bitline evaluation circuitry for generating global bitlines with a global bitline enable triggered by a falling transition of a system clock with reduced power consumption.

In this regard, FIG. 6 illustrates another exemplary SRAM 172 employing a global bitline scheme that uses the global bitline enable generation circuit 96(0) configured to generate the global bitline enable 98 based on a falling transition of a system clock 46. This embodiment includes an SRAM data array 16, a memory access circuit 108(0), and a global bitline enable generation circuit 96(0) similar to those previously described in FIG. 3. An SRAM global bitline circuit 174(0) includes the global bitline enable generation circuit 96(0) and a bitline evaluation circuit 176(0). However, as illustrated in FIG. 6 and discussed below in more detail, rather than including a latch, the bitline evaluation circuit 176(0) within the SRAM global bitline circuit 174(0) includes tri-state logic 177(0) that places the aggregated read bitline 104(0) onto the global bitline 102(0). "Tri-state logic" is logic that allows three unique states on an output port: a logical '1,' a logical '0,' and a high impedance. The high impedance state results in the output port of the logic providing neither a logical '1' nor a logical '0,' meaning that the output of the tri-state logic has no effect on the rest of a circuit. When the tri-state logic operates in the high impedance state, the tri-state logic functions similar to an open switch, meaning that no current is transferred through the tri-state logic. Thus, operating in the high impedance state of tri-state logic reduces power consumption.

With continuing reference to FIG. 6, the bitline evaluation circuit 176(0) includes an AND-based gate 178(0) (e.g., a NAND gate) that receives the aggregated read bitline 104(0) and the global bitline enable 98. The bitline evaluation circuit 176(0) also includes an inverter 180(0) that receives the aggregated read bitline 104(0). A pull-up transistor 182(0) and a pull-down transistor 184(0) are also included in the bitline evaluation circuit 176(0). A "pull-up" transistor is used to place a source voltage onto an output having a logical '1' value by coupling the output to a source voltage. This helps to ensure that an intended logical '1' value remains at a proper voltage level. A "pull-down" transistor is used to place a voltage equal to ground on an output having a logical '0' value by coupling the output to a ground voltage. This helps to ensure that an intended logical '0' value remains at a proper voltage level. The pull-up transistor 182(0) receives the output of the AND-based gate 178(0), and couples the global bitline 102(0) to a source voltage 186 when the aggregated read bitline 104(0) and the global bitline enable 98 each have a logical '1' value. The pull-down transistor 184(0) receives the output of the inverter 180(0), and couples the global bitline 102(0) to a ground voltage 188 when the aggregated read bitline 104(0) has a logical '0' value.

It is important to note that the path which includes the inverter 180(0) is not dependent on the global bitline enable 98. This is because activation of this path can only result in a logical '0' being placed onto the global bitline 102(0), and cannot result in placing an errant logical '1' value onto the global bitline 102(0). Thus, is it unnecessary to control the timing of this path with the global bitline enable 98 because the path cannot propagate a power glitch to the global bitline 102(0). In the instance in which the aggregated read bitline 104(0) has a logical '1' value, but the global bitline enable 98 has a logical '0' value, the bitline evaluation circuit 176(0) operates in a high impedance state, and provides no value to the global bitline 102(0). Thus, using tri-state logic 177(0) in the bitline evaluation circuit 176(0) may further reduce power consumption within the SRAM 172 by transmitting a current onto the global bitline 102(0) only when data needs to be placed onto the global bitline 102(0).

With continuing reference to FIG. 6, an alternative embodiment of a global bitline enable generation circuit 190 is also provided. The alternate global bitline enable generation circuit 190 includes an AND-based gate 192 (e.g., a NAND gate) that receives the pre-charge 132. An OR-based gate 194 (e.g., a NOR gate) is also included that receives the system clock 46 and the output of the AND-based gate 194. In this manner, the alternate global bitline enable generation circuit 190 generates a global bitline enable 196 triggered by the falling transition of the system clock 46. Similarly to the scenario described above, power glitches on the global bitline 102(0) caused by the bitline evaluation circuit 176(0) prematurely placing the aggregated read bitline 104(0) onto the global bitline 102(0) in response to the global bitline enable 196 rising too early may be reduced or avoided without adding a delay to the global bitline enable 196. As a result of reducing or avoiding such power glitches in this fashion, associated increases in power consumption may be reduced or avoided without increasing memory read access latency.

The SRAM global bitline circuits for reducing power glitches during memory read accesses, and related methods and systems according to embodiments disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

Figure 7:
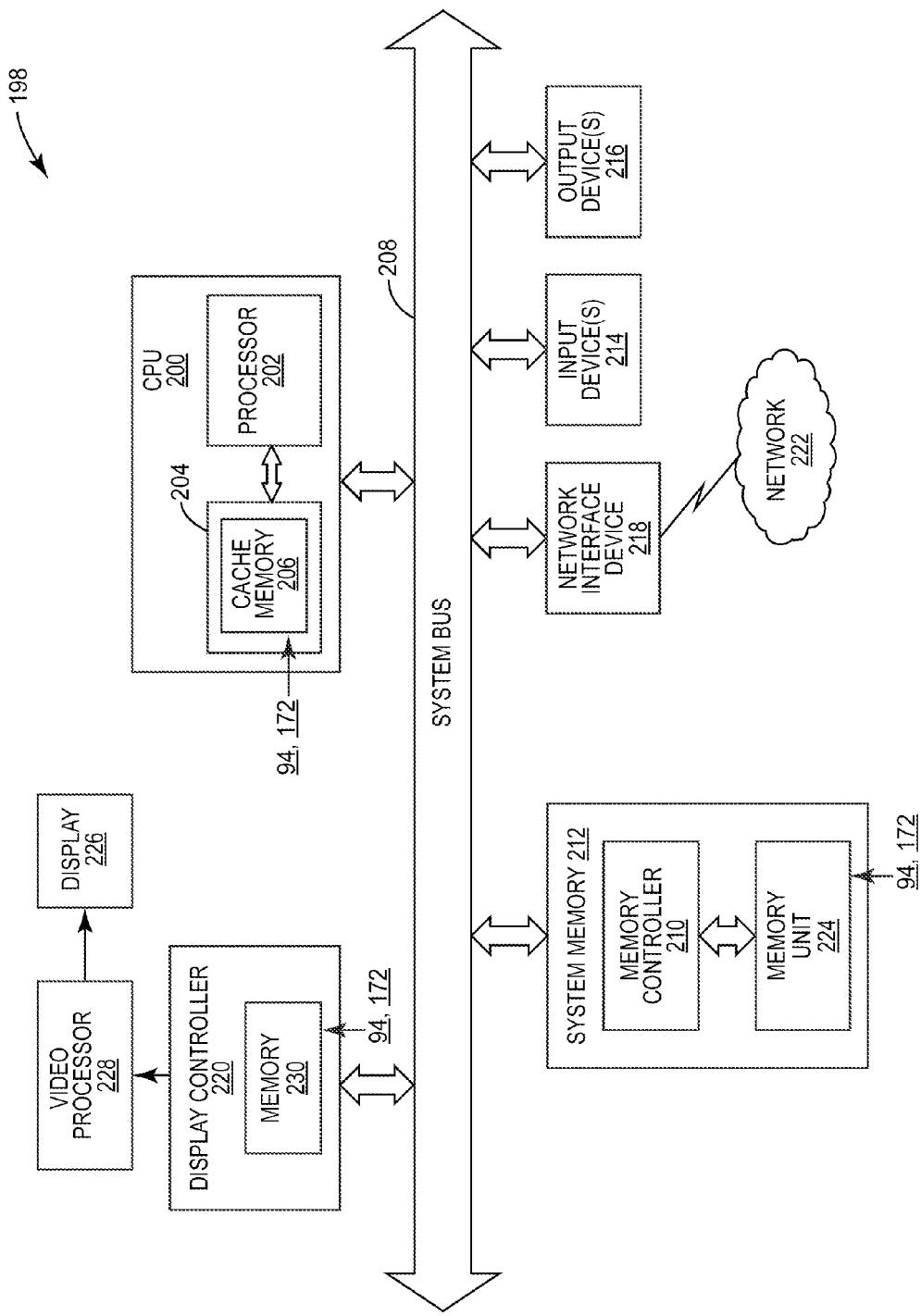
FIG. 7 is a block diagram of an exemplary processor-based system that can include an SRAM circuit employing global bitlines with a global bitline enable triggered by a falling transition of a system clock, so as to reduce power glitches during memory read accesses without increased latency.

In this regard, FIG. 7 illustrates an example of a processor-based system 198 that can employ the SRAM global bitline circuits 110(0) and 174(0) illustrated in FIGS. 3 and 6 for reducing power glitches during memory read accesses. In this example, the processor-based system 198 includes one or more central processing units (CPUs) 200, each including one or more processors 202. The CPU(s) 200 may have cache memory 204 coupled to the processor(s) 202 for rapid access to temporarily stored data. A cache memory unit 206 within the cache memory 204 may be any type of memory, including, but not limited to, the SRAM 94 and the SRAM 172 of FIGS. 3 and 6, respectively. The CPU(s) 200 is coupled to a system bus 208 and can intercouple master and slave devices included in the processor-based system 198. As is well known, the CPU(s) 200 communicates with these other devices by exchanging address, control, and data information over the system bus 208. For example, the CPU(s) 200 can communicate bus transaction requests to a memory controller 210 as an example of a slave device. Although not illustrated in FIG. 7, multiple system buses 208 could be provided, wherein each system bus 208 constitutes a different fabric.

Other master and slave devices can be connected to the system bus 208. As illustrated in FIG. 7, these devices can include a system memory 212, one or more input devices 214, one or more output devices 216, one or more network interface devices 218, and one or more display controllers 220, as examples. The input device(s) 214 can include any type of input device, including but not limited to input keys, switches, voice processors, etc. The output device(s) 216 can include any type of output device, including but not limited to audio, video, other visual indicators, etc. The network interface device(s) 218 can be any devices configured to allow exchange of data to and from a network 222. The network 222 can be any type of network, including but not limited to a wired or wireless network, a private or public network, a local area network (LAN), a wide local area network (WLAN), and the Internet. The network interface device(s) 218 can be configured to support any type of communication protocol desired. The system memory 212 can include one or more memory unit 224. A memory unit 224 within the system memory 212 may be any type of memory, including, but not limited to, the SRAM 94 and the SRAM 172 of FIGS. 3 and 6, respectively.

The CPU(s) 200 may also be configured to access the display controller(s) 218 over the system bus 208 to control information sent to one or more displays 226. The display controller(s) 220 sends information to the display(s) 226 to be displayed via one or more video processors 228, which process the information to be displayed into a format suitable for the display(s) 226. The display(s) 226 can include any type of display, including but not limited to a cathode ray tube (CRT), a liquid crystal display (LCD), a plasma display, etc. A memory unit 230 within the display controller 220 may be any type of memory, including, but not limited to, the SRAM 94 and the SRAM 172 of FIGS. 3 and 6, respectively.

Those of skill in the art will further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. The master devices and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the embodiments disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The embodiments disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A static random access memory (SRAM) global bitline circuit for a plurality of SRAM bitcells, comprising:
   a global bitline enable generation circuit configured to generate a global bitline enable in response to a falling transition of a system clock; and
   a bitline evaluation circuit coupled to an aggregated read bitline configured to receive data stored in a selected SRAM bitcell among a plurality of SRAM bitcells of an SRAM data array, the bitline evaluation circuit configured to:
      receive the data from the selected SRAM bitcell on the aggregated read bitline; and
      generate a global bitline provided as an SRAM data for the SRAM data array containing the data in response to the global bitline enable.

2. The SRAM global bitline circuit of claim 1, further comprising an output latch configured to receive and latch the global bitline in response to a rising transition of the system clock.

3. The SRAM global bitline circuit of claim 1, wherein the bitline evaluation circuit further comprises a latch configured to latch the data from the aggregated read bitline and provide the data to the global bitline in response to the global bitline enable.

4. The SRAM global bitline circuit of claim 1, wherein the bitline evaluation circuit further comprises:
   a pull-up transistor configured to couple the global bitline to a source voltage in response to the global bitline enable and the data on the aggregated read bitline being a logical high value; and
   a pull-down transistor configured to couple the global bitline to a ground voltage in response to the data on the aggregated read bitline being a logical low value.

5. The SRAM global bitline circuit of claim 4, wherein:
   the pull-up transistor is further configured to not couple the global bitline to the source voltage if the global bitline enable is not enabled; and
   the pull-down transistor is further configured to not couple the global bitline to the ground voltage if the data on the aggregated read bitline is a logical high value.

6. The SRAM global bitline circuit of claim 1, wherein the global bitline enable generation circuit is configured to generate the global bitline enable in response to the falling transition of the system clock and an active high global bitline enable.

7. The SRAM global bitline circuit of claim 1, wherein the global bitline enable generation circuit is configured to generate the global bitline enable in response to the falling transition of the system clock and a pre-charge.

8. The SRAM global bitline circuit of claim 1 integrated into an integrated circuit (IC).

9. The SRAM global bitline circuit of claim 1 integrated into a device selected from the group consisting of a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

10. A static random access memory (SRAM) global bitline circuit for a plurality of SRAM bitcells, comprising:
    means for generating a global bitline enable in response to a falling transition of a system clock;
    means for receiving data read from a selected SRAM bitcell among a plurality of SRAM bitcells on an aggregated read bitline configured to receive the data stored in the selected SRAM bitcell of an SRAM data array; and
    means for generating a global bitline provided as an SRAM data for the SRAM data array containing the data in response to the global bitline enable.

11. A method of generating a static random access memory (SRAM) global bitline, comprising:
    generating a global bitline enable in response to a falling transition of a system clock;
    receiving data from a selected SRAM bitcell among a plurality of SRAM bitcells on an aggregated read bitline, wherein the data stored in the selected SRAM bitcell among the plurality of SRAM bitcells of an SRAM data array is placed onto the aggregated read bitline; and
    generating a global bitline provided as an SRAM data for the SRAM data array containing the data in response to the global bitline enable.

12. The method of claim 11, further comprising:
    pre-charging a plurality of read bitlines of the plurality of SRAM bitcells in the SRAM data array to generate a plurality of pre-charged read bitlines in response to a pre-charge;
    reading the data stored in the selected SRAM bitcell onto a corresponding pre-charged read bitline among the plurality of pre-charged read bitlines; and
    aggregating the plurality of pre-charged read bitlines into the aggregated read bitline to place the data from the selected SRAM bitcell onto the aggregated read bitline.

13. The method of claim 12, wherein reading the data stored in the selected SRAM bitcell comprises:
    receiving the data stored in a corresponding SRAM bitcell among the plurality of SRAM bitcells onto a corresponding data input among a plurality of data inputs; and
    providing the data onto the corresponding pre-charged read bitline among the plurality of pre-charged read bitlines; and
    further comprising inverting the global bitline to provide an inverted global bitline as the SRAM data.

14. The method of claim 11, further comprising:
    latching the data from the aggregated read bitline into a latch; and
    providing the data from the latch to the global bitline in response to the global bitline enable.

15. The method of claim 11, further comprising:
    pulling-up the global bitline to a source voltage in response to the global bitline enable and the data on the aggregated read bitline being a logical high value; and
    pulling-down the global bitline to a ground voltage in response to the data on the aggregated read bitline being a logical low value.

16. The method of claim 15, further comprising:
    not pulling-up the global bitline to the source voltage if the global bitline enable is not enabled; and
    not pulling-down the global bitline to the ground voltage if the data on the aggregated read bitline is a logical high value.

17. The method of claim 11, comprising generating the global bitline enable in response to the falling transition of the system clock and an active high global bitline enable.

18. The method of claim 11, comprising generating the global bitline enable in response to the falling transition of the system clock and a pre-charge.

19. A static random access memory (SRAM) comprising:
    an SRAM data array comprised of a plurality of columns;
    a plurality of memory access circuits, each memory access circuit among the plurality of memory access circuits operatively associated with a column among the plurality of columns, each of the plurality of memory access circuits configured to:
        pre-charge a plurality of read bitlines of a plurality of SRAM bitcells in a corresponding column to generate a plurality of pre-charged read bitlines in response to a pre-charge;
        read data stored in a selected SRAM bitcell among the plurality of SRAM bitcells onto a corresponding pre-charged read bitline among the plurality of pre-charged read bitlines; and
        aggregate the plurality of pre-charged read bitlines into an aggregated read bitline to place the data from the selected SRAM bitcell onto the aggregated read bitline;
    a plurality of SRAM global bitline circuits, each SRAM global bitline circuit among the plurality of SRAM global bitline circuits operatively associated with a memory access circuit among the plurality of memory access circuits, each of the plurality of SRAM global bitline circuits comprising:
        a global bitline enable generation circuit configured to generate a global bitline enable in response to a falling transition of a system clock; and
        a bitline evaluation circuit coupled to the aggregated read bitline configured to receive the data stored in the selected SRAM bitcell among the plurality of SRAM bitcells of the SRAM data array, the bitline evaluation circuit configured to receive the data from the selected SRAM bitcell on the aggregated read bitline, and generate a global bitline as an SRAM data for the SRAM data array containing the data in response to the global bitline enable; and
    a row data output comprised of a plurality of SRAM data of the plurality of SRAM global bitline circuits.

20. The SRAM of claim 19, wherein each memory access circuit among the plurality of memory access circuits further comprises a plurality of data inputs, each of the plurality of data inputs coupled to a corresponding SRAM bitcell among the plurality of SRAM bitcells;
    each memory access circuit configured to read the data stored in the selected SRAM bitcell by being configured to receive the data stored in the corresponding SRAM bitcell onto a corresponding data input among the plurality of data inputs and provide the data onto the corresponding pre-charged read bitline among the plurality of pre-charged read bitlines.

* * * * *